(12) United States Patent
Iida et al.

(10) Patent No.: US 9,769,936 B2
(45) Date of Patent: Sep. 19, 2017

(54) PRODUCTION METHOD OF CIRCUIT BOARD

(71) Applicant: FUJITSU LIMITED, Kawasaki-shi, Kanagawa (JP)

(72) Inventors: Kenji Iida, Nagano (JP); Takashi Nakagawa, Kawasaki (JP); Seigo Yamawaki, Nagano (JP); Yasuhiro Karahashi, Nagano (JP); Junichi Kanai, Nagano (JP); Koji Komemura, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 359 days.

(21) Appl. No.: 14/300,360

(22) Filed: Jun. 10, 2014

(65) Prior Publication Data

US 2015/0029679 A1 Jan. 29, 2015

(30) Foreign Application Priority Data

Jul. 25, 2013 (JP) ................................. 2013-154705

(51) Int. Cl.
*H01K 3/10* (2006.01)
*H05K 3/46* (2006.01)
(Continued)

(52) U.S. Cl.
CPC ......... *H05K 3/4623* (2013.01); *H05K 3/4069* (2013.01); *H05K 3/007* (2013.01);
(Continued)

(58) Field of Classification Search
CPC ...... H05K 3/46; H05K 1/09; Y10T 29/49165; Y10T 29/49155; Y10T 29/49124; Y10T 29/49117; Y10T 29/49002
(Continued)

(56) References Cited

U.S. PATENT DOCUMENTS

2006/0044735 A1 3/2006 Hayashi et al.
2007/0246254 A1* 10/2007 Kumar ................ H05K 3/4614
174/264
(Continued)

FOREIGN PATENT DOCUMENTS

JP 2003-086940 A 3/2003
JP 2004-047898 A 2/2004
(Continued)

OTHER PUBLICATIONS

Taiwanese Office Action application No. 103120727 dated Oct. 27, 2015.
(Continued)

*Primary Examiner* — Peter DungBa Vo
*Assistant Examiner* — Azm Parvez
(74) *Attorney, Agent, or Firm* — Squire Patton Boggs (US) LLP

(57) ABSTRACT

A method for producing circuit board, including: adhering plastic deformable insulating material onto surface of laminate, which contains second-metal-layer of second metal, and first-metal-layer in pattern on second-metal-layer, and the surface of the laminate is surface of second-metal-layer where first-metal-layer is formed, and surface of first-metal-layer, followed by curing the material, and removing second-metal-layer to form plate structure to which first-metal-layer in pattern is formed; opening hole in cured material from surface of the plate structure opposite to surface thereof where first-metal-layer is formed, until the hole reaches first-metal-layer; filling the hole with electroconductive paste, to form the plate structure filled therewith; and laminating one plate structure filled therewith with the other plate structure filled therewith in manner that first-metal-layer of one plate structure filled therewith faces opening of
(Continued)

the hole of other plate structure filled therewith, wherein first-metal-layer contains metal different from second metal.

4 Claims, 17 Drawing Sheets

(51) Int. Cl.
  *H05K 3/40* (2006.01)
  *H05K 3/00* (2006.01)
(52) U.S. Cl.
  CPC ..... *H05K 3/0035* (2013.01); *H05K 2201/096* (2013.01); *Y10T 29/49165* (2015.01)
(58) Field of Classification Search
  USPC ....... 29/852, 846, 829, 825, 592.1; 361/748; 156/182; 174/255
  See application file for complete search history.

(56) References Cited

U.S. PATENT DOCUMENTS

| | | | |
|---|---|---|---|
| 2008/0264684 | A1 | 10/2008 | Kang et al. |
| 2009/0294056 | A1 | 12/2009 | Yoshimura et al. |
| 2011/0169164 | A1* | 7/2011 | Nakamura .......... H01L 21/4857 257/739 |
| 2011/0289774 | A1 | 12/2011 | Kumar et al. |
| 2011/0311790 | A1* | 12/2011 | Okada .................. C09J 9/02 428/209 |

FOREIGN PATENT DOCUMENTS

| | | |
|---|---|---|
| JP | 2004-158671 A | 6/2004 |
| JP | 2006-73622 A | 3/2006 |
| JP | 2009-054773 A | 3/2009 |
| JP | 2009-094403 A | 4/2009 |
| KR | 10-2008-0096985 A | 11/2008 |
| KR | 2009-0124914 A | 12/2009 |

OTHER PUBLICATIONS

Korean Office Action application No. 10-2014-74935 dated Apr. 28, 2015.

Ryohei Kataoka et al., "Semiconductor Packaging Technology Based on the PALAP Process," DENSO Technical Review, vol. 10, No. 2, 2005, pp. 77-84.

"ALL-B2it printed wiring board," Product Information, http://www.dnp.co.jp/semi/j/b2it/03.html20070080438, and English translation thereof, retrieved Jul. 16, 2013.

Rabindra N. Das et al., "Z-axis interconnections for next generation packaging," International Microelectronics Assembly and Packaging Society, IMAPS_2011 technical program page, Nov./Dec. 2011, pp. 12-19.

"FC-BGA Substrates (SHDBU)," Kyocera, http://www.kyocera-slc.co.jp/english/products/shdbu.html, retrieved Jul. 16, 2013, 2 pages.

Korean Office Action, with English translation, corresponding to Korean Patent Application No. 10-2016-0058719, dated Feb. 27, 2017.

Japanese Office Action, with Machine English translation, corresponding to Japanese Patent Application No. 2013-154705, dated Mar. 14, 2017.

Japanese Office Action, with Machine English translation, corresponding to Japanese Patent Application No. 2013-154705, dated Jun. 20, 2017.

* cited by examiner

PRODUCTION METHOD OF CIRCUIT BOARD

CROSS-REFERENCE TO RELATED APPLICATIONS

This application is based upon and claims the benefit of priority of the prior Japanese Patent Application No. 2013-154705, filed on Jul. 25, 2013, the entire contents of which are incorporated herein by reference.

FIELD

The embodiment discussed herein relates to a circuit board, a method for producing a circuit board, and electronic equipment.

BACKGROUND

Conventionally, a circuit board, such as a printed circuit board, has been commonly and widely used in order to compactly incorporate electronic parts into electronic equipment. The printed circuit board contains a copper foil, which is adhered onto a laminate board, and is etched along an electronic circuit pattern. The printed circuit board is advantageous in terms of a cost, but it is difficult to pack electronic parts with high density.

Meanwhile, there is a rapid trend for making more minute and more laminated layers of an electronic circuit of a circuit board, and for realizing a higher density packaging of electronic parts, corresponding to the demands for electronic equipment having a smaller size, higher performances, and lower price. Therefore, a study of a build-up multilayer circuit board for use as a circuit board has been actively conducted.

As for the build-up multilayer circuit board, for example, disclosed is a build-up multilayer substrate, in which a substrate layer formed of an insulating material (an organic material layer, such as of an epoxy resin) is sequentially laminated on both surfaces of a core material serving as a base (see, for example, Japanese Patent Application Laid-Open (JP-A) No. 2004-158671).

In the disclosed method, formation of multiple layers is realized by sequentially forming (building up) a substrate layer, such as an insulating material (an organic material layer, such as of an epoxy resin), which has an electroconductive pattern formed of a copper foil, such as an electrolysis copper foil, on the core material.

The disclosed method however has problems that a production process is extremely long, and a production cost is high.

Therefore, disclosed is a production method of a package substrate for a semiconductor device, in which a plurality of thermoplastic resin layers are formed, electroconductive vias are formed in all of the thermoplastic resin layers, or the all of the thermoplastic resin layer excluding the outermost layer, where the vias penetrate through in the thickness direction of the thermoplastic resin layer, a metal layer for constituting an electroconductive pattern is provided on a surface of at least one thermoplastic resin layer, the plurality of the thermoplastic resin layer are laminated, and are collectively heated and pressed to fixed to each other to integrate (see, for example, JP-A No. 2006-073622).

The disclosed method however has a problem that a thickness of an obtained package substrate is not uniform because of surface irregularities of the plurality of the thermoplastic resin layers formed when the plurality of the thermoplastic resin layer are laminated and are collectively heated and pressed to fix to each other to integrate.

Accordingly, there is currently a need for a circuit board, which can be produced with a short production process, and has a uniform thickness, a production process thereof, and electronic equipment containing the circuit board.

SUMMARY

The disclosed method for producing a circuit board includes:

adhering a plastic deformable insulating material onto a surface of a laminate, where the laminate contains a second metal layer formed of a second metal, and a first metal layer in the form of a pattern formed on the second metal layer, and the surface of the laminate is a surface of the second metal layer at which the first metal layer has been formed, and onto a surface of the first metal layer, followed by curing the insulating material, and removing the second metal layer to form a plate structure to which the first metal layer in the form of a pattern is formed;

opening a hole in the cured insulating material from a surface of the plate structure opposite to a surface thereof at which the first metal layer has been formed, until the hole reaches the first metal layer;

filling the hole with an electroconductive paste, to form the plate structure filled with the electroconductive paste; and laminating one plate structure filled with the electroconductive paste with the other plate structure filled with the electroconductive paste in a manner that the first metal layer of the one plate structure filled with the electroconductive paste faces an opening of the hole of the other plate structure filled with the electroconductive paste, wherein the first metal layer contains a metal different from the second metal.

The disclosed circuit board contains:

a plurality of plate structures, each containing:

a cured insulating material;

a first metal layer in the form of a pattern, formed on one surface of the insulating material; and an electroconductive paste, loaded in a hole formed in the insulating material and reaching the first metal layer from a surface of the plate structure opposite to a surface thereof at which the first metal layer has been formed, wherein the first metal layer is embedded in the insulating material in the plate structure, and one surface of the first metal layer and one surface of the insulating material are on an identical plane, and wherein, among the plurality of the plate structures, a first plate structure filled with the electroconductive paste and a second plate structure filled with the electroconductive plate are provided in a manner that the first metal layer of the first plate structure faces an opening of the hole of the second plate structure.

The disclosed circuit board contains:

a plurality of plate structures, each containing:

a cured insulating material;

a first metal layer in the form of a pattern formed on one surface of the insulating material; and a via formed in the insulating material, where the via reaches the first metal layer from a surface of the insulating material opposite to a surface thereof, at which the first metal layer has been formed, wherein the first metal layer is embedded in the insulating material in the plate structure, and one surface of the first metal layer and one surface of the insulating material are on an identical plane, and wherein, among the plurality of the plate structures, a first plate structure containing the via and a second plate structure containing the via are provided in a manner that the first metal layer of the first plate structure faces an opening of a via of the second plate structure.

The disclosed electronic equipment contains the disclosed circuit board, and electronic parts.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Figure 1:
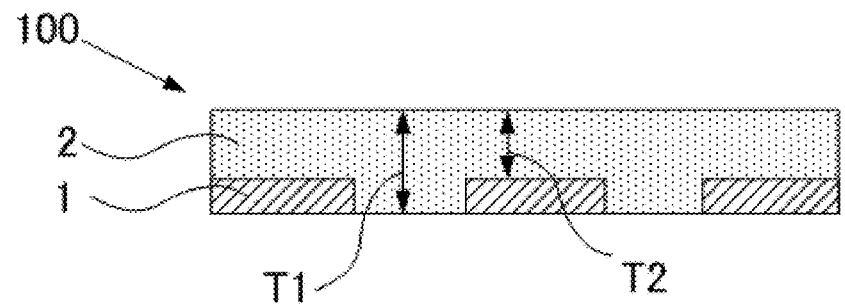
FIG. 1 is a schematic cross-sectional view illustrating one example of a plate structure.

DESCRIPTION OF EMBODIMENTS (Method for Producing Circuit Board)

The disclosed method for producing a circuit board contains at least: forming a plate structure; opening a hole in the cured insulating material until reaching; forming the plate structure filled with an electroconductive paste; and laminating. The method may further contain other steps according to the necessity.

<Formation of Plate Structure>

The formation of a plate structure is appropriately selected depending on the intended purpose without any limitation, provided that it contains adhering a plastic deformable insulating material onto a surface of a laminate, where the laminate contains a second metal layer formed of a second metal, and a first metal layer in the form of a pattern formed on the second metal layer, and the surface of the laminate is a surface of the second metal layer at which the first metal layer has been formed, and onto a surface of the first metal layer, followed by curing the insulating material, and removing the second metal layer to form a plate structure to which the first metal layer in the form of a pattern is formed.

The second metal for forming the second metal layer is appropriately selected depending on the intended purpose without any limitation, and examples thereof include nickel, and copper.

The first metal layer contains at least a metal different from the second metal.

The metal for forming the first metal layer is appropriately selected depending on the intended purpose without any limitation.

The first metal layer may have a single-layer structure, or a multi-layer structure. In the case where the first metal layer has a single-layer structure, the metal for forming the first metal layer is a metal different from the second metal for forming the second metal layer. In the case where the first metal layer has a multi-layer structure, a metal for forming a layer in contact with the second metal layer in the multi-layer structure is a metal different from the second metal for forming the second metal layer. As a result of the aforementioned selection of the metal, the second metal layer or the first metal layer can be selectively removed by etching.

Examples of the first metal layer include a single-layer structure of copper, and a two-layer structure composed of copper and nickel.

The first metal layer is composed of a material that is not removed with the second metal layer when the second metal layer is removed (for example, removed by etching).

A surface of the first metal layer at the side of the second metal layer is preferably a rough surface. A formation method of the rough surface is appropriately selected depending on the intended purpose without any limitation, and examples thereof include a CZ surface treatment (a treatment of copper surface of zigzag). As the aforementioned surface is a rough surface, adhesion with the second metal layer can be improved. The arithmetic average roughness (Ra) of the rough surface thereof is, for example, 1.0 µm to 2.0 µm.

In the case where the second metal for forming the second metal layer is nickel, for example, the first metal layer has a single-layer structure composed of copper. In the case where the second metal for forming the second metal layer is copper, the first metal layer has a two-layer structure composed of nickel and copper, where a layer formed of nickel and a layer formed of copper are formed as the first metal layer in this order on the second metal layer. As a result, the second metal layer can be selectively removed by etching.

A method for forming the first metal layer in the form of a pattern is appropriately selected depending on the intended purpose without any limitation, and examples thereof include a subtractive (etching) process, and a semi-additive (plating) process. The aforementioned methods can be performed using photolithography.

The insulating material is appropriately selected depending on the intended purpose without any limitation, and examples thereof include a prepreg. The insulating material preferably contains a thermosetting resin. Examples of the thermosetting resin include an epoxy resin.

The prepreg is a sheet, in which a woven cloth of carbon fibers or glass fibers, or fibers pulled and orientated in one direction is immersed in a resin.

Examples of the resin include a thermosetting resin.

<Opening Hole in Cured Insulating Material Until First Metal Layer>

The opening a hole in the cured insulating material until the first metal layer is appropriately selected depending on the intended purpose without any limitation, provided that it contains opening a hole in the cured insulating material from a surface of the plate structure opposite to a surface thereof at which the first metal layer has been formed, until the hole reaches the first metal layer. Examples thereof include a method for opening a hole using laser.

The laser is appropriately selected depending on the intended purpose without any limitation, and examples thereof include $CO_2$ laser, and YAG laser.

The output of the laser is appropriately selected depending on the intended purpose without any limitation.

As for the hole, a size (opening diameter) of the hole is appropriately selected depending on the intended purpose without any limitation, provided that the hole is a hole reaching the first metal layer. For example, the size thereof is 50 µm or greater.

A shape of the hole is appropriately selected depending on the intended purpose without any limitation, and examples thereof include a (tapered) shape where a diameter thereof is gradually reduced from the opening to the first metal layer.

A number of the holes in the plate structure is appropriately selected depending on the intended purpose without any limitation.

<Formation of Plate Structure Filled with Electroconductive Paste>

The formation of the plate structure filled with electroconductive paste is appropriately selected depending on the intended purpose without any limitation, provided that it contains filling the hole with an electroconductive paste to form the plate structure filled with the electroconductive paste.

The electroconductive paste is appropriately selected depending on the intended purpose without any limitation, and examples thereof include an electroconductive paste containing metal particles (electroconductive filler), and a fluid binder resin.

Examples of metal constituting the metal particles include copper, gold, silver, palladium, nickel, tin, lead, and bismuth. These may be used alone, or in combination.

Examples of the binder resin include a thermosetting resin, such as an epoxy resin. However, the binder resin is not limited to the epoxy resin, and may be another resin, such as a polyimide resin.

The electroconductive paste is obtained, for example, by kneading the fluid binder resin, and the metal particles. The electroconductive paste may contain flux.

The electroconductive paste may be of pressure welding type, or of melting type. The electroconductive paste of the pressure welding type is an electroconductive paste capable of realizing conduction connection between layers, as a low resistant metal powder (electroconductive filler) is not melted with heat applied during the laminating, but the conductive filler is brought in contact with each other only by pressure applied during the laminating. The electroconductive paste of the pressure welding type loses fluidity thereof as the resin contained in the electroconductive paste is cured by heat.

The electroconductive paste of melting type is an electroconductive paste capable of realizing conduction connection between layers, as a low melting point metal powder (electroconductive filler) is melted with heat applied during the laminating, and is cured to surround a high melting point metal powder (electroconductive filler) to form an alloy layer.

A method for filling the hole with the electroconductive paste is appropriately selected depending on the intended purpose without any limitation, and examples thereof include a method containing filling the hole with the electroconductive paste using a squeegee under the atmospheric or vacuum condition.

<Laminating>

The laminating is appropriately selected depending on the intended purpose without any limitation, provided that is contains laminating one plate structure filled with the electroconductive paste with the other plate structure filled with the electroconductive paste in a manner that the first metal layer of the one plate structure filled with the electroconductive paste faces an opening of the hole of the other plate structure filled with the electroconductive paste. Examples thereof include: a method containing providing the one plate structure filled with the electroconductive paste, and the other plate structure filled with the electroconductive paste in the manner that the first metal layer of the one plate structure filled with the electroconductive paste faces an opening of the hole of the other plate structure filled with the electroconductive paste to form a laminate, and pressurizing the laminate of the aforementioned plate structure; and a method containing heating and pressurizing the laminate of the aforementioned plate structure.

The pressure during the pressing, and the heating temperature during the heating are appropriately selected depending on the intended purpose without any limitation.

In the method for producing a circuit board, the curing of the insulating material in the formation of the plate structure is preferably complete curing. When opening a hole in the cured insulating material, moreover, the plate structure preferably contains an adhesive layer and a release layer in this order on a surface of the plate structure opposite to a surface thereof at which the first metal layer has been formed. Furthermore, the release layer is preferably peeled after filling the hole with the electroconductive paste.

Since the curing of the insulating material in the formation of the plate structure is complete curing, an obtained circuit board has excellent size stability, and thicknesses of the plate structures each filled with the electroconductive paste can be made uniform.

As the plate structure contains the adhesive layer, adhesion between the plate structures is high in the laminating.

Since the plate structure contains the release layer, and the release layer is peeled off after filling the hole with the electroconductive paste, moreover, the electroconductive paste is formed into a state where the electroconductive paste is elevated in a convex shape from a surface of the plate structure. As a result, the elevated part of the electroconductive paste in the convex shape is pushed into the hole during the laminating, and therefore the internal pressure of the hole increase to thereby improve connectivity between the electroconductive pastes. A state of the electroconductive paste during this process is preferably a pressure welded state, or a state of a metal bulk formed of an alloy, which is formed by melting with laminating heat.

In the present specification, the complete curing means to complete curing of a resin constituting the insulating material. To complete curing means a state where curing is hardly progressed upon further application of heat. Examples of the complete curing include a C stage (a final stage of a reaction).

The adhesive layer and the release layer are preferably collectively laminated, as a duration of the process can be shortened.

The adhesive layer is appropriately selected depending on the intended purpose without any limitation, provided that it is a layer capable of bonding the cured insulating materials to each other, and examples thereof include an adhesive layer having the similar characteristics to those of the insulating material.

The release layer is appropriately selected depending on the intended purpose without any limitation, and examples thereof include a polyethylene terephthalate film. The average thickness of the release layer is appropriately selected depending on the intended purpose without any limitation, but the average thickness thereof is preferably 5 μm to 25 μm, in view of fluidity and scattering of the electroconductive paste when the plate structure is laminated.

In the method for producing a circuit board, the curing of the insulating material in the formation of the plate structure is preferably semi-curing. When opening a hole in the cured insulating material, moreover, the plate structure preferably contains a release layer on a surface of the plate structure opposite to a surface thereof at which the first metal layer has been formed. Furthermore, the release layer is preferably peeled after filling the hole with the electroconductive paste.

Since the curing of the insulating material in the production of the plate structure is semi-curing, it is not necessary to provide an adhesive layer to an obtained circuit board, and therefore curling of the circuit board caused due to an adhesive layer can be prevented.

Since the plate structure contains the release layer, and the release layer is peeled off after filling the hole with the electroconductive paste, moreover, the electroconductive paste is formed into a state where the electroconductive paste is elevated in a convex shape from a surface of the plate structure. As a result, the elevated part of the electroconductive paste in the convex shape is pushed into the hole during the laminating, and therefore the internal pressure of the hole increase to thereby improve connectivity between the electroconductive pastes. A state of the electroconductive paste during this process is preferably a pressure welded state, or a state of a metal bulk formed of an alloy, which is formed by melting with laminating heat.

In the present specification, the semi-curing means that curing of a resin constituting the insulating material has not been completed. To complete curing means a state where curing is hardly progressed upon further application of heat. Examples of the semi-curing include a B stage (an intermediate stage of a reaction that is a stage where a material is softened to expand upon application of heat, but is not completely dissolved or melted in contact with a certain type of a liquid). In the case where a curing rate in the complete curing is determined as 100%, moreover, the semi-curing has, for example, the curing rate of 30% to 60%.

In the method for producing a circuit board, the laminate preferably contains a metal support, the second metal layer, and the first metal layer in the form of a pattern in this order. Moreover, the plate structure is preferably formed by removing the metal support after curing the insulating material.

As the laminate contains the metal support, a strength of the laminate is enhanced so that the laminate to which a subtractive process or semi-additive process can be applied, can be obtained, and production of the laminate becomes easy.

A metal for forming the metal support is appropriately selected depending on the intended purpose without any limitation, and examples thereof include nickel, and copper.

The metal for forming the metal support is preferably different from the second metal for forming the second metal layer. Use of such a metal enables to selectively remove the metal support or the second metal layer through etching.

In the method for producing a circuit board, the laminate preferably contains the metal support, the second metal layer, and the first metal layer in the form of a pattern, in this order. Moreover, a third metal layer is preferably formed on the insulating material, after adhering the insulating layer on a surface of the second metal layer of the laminate to which the first metal layer has been formed, and on the first metal layer, but before completely curing the insulating material. Moreover, a plate structure is preferably formed by removing the metal support and the third metal layer, after complete curing the insulating material.

As the laminate contains the metal support, a strength of the laminate is enhanced so that the laminate to which a subtractive process or semi-additive process can be applied, can be obtained, and production of the laminate becomes easy.

As the third metal layer is formed on the insulating material, moreover, curling of the laminate is prevented when the insulating material is cured.

The arithmetic average roughness (Ra) of the surface of the third metal layer, which is in contact with the insulating material, is appropriately selected depending on the intended purpose without any limitation, but the arithmetic average roughness (Ra) thereof is preferably 1.0 µm or less, more preferably 0.6 µm to 0.9 µm. When the Ra is within the aforementioned preferable range, a thin adhesive layer (for example, 3 µm to 8 µm) can be provided when the adhesive layer is provided to the plate structure. The thin adhesive layer is advantageous, because an amount of the adhesive layer discharged outside the periphery of the circuit board is reduced when the adhesive layer of each layer (plate structure) is melted with heat applied during the laminating, to thereby keep a thickness of the circuit board uniform. Moreover, adhesion between the insulating material and the adhesive layer can be improved.

(Circuit Board)

The disclosed circuit board contains a plurality of plate structures, each of which contains a cured insulating material, a first metal layer in the form of a pattern formed on one surface of the insulating material, and an electroconductive paste loaded in a hole formed in the insulating material and reaching the first metal layer from a surface of the plate structure opposite to a surface thereof at which the first metal layer has been formed.

The first metal layer is embedded in the insulating material in the plate structure, and one surface of the first metal layer and one surface of the insulating material are on an identical plane.

Among the plurality of the plate structures, a first plate structure filled with the electroconductive paste and a second plate structure filled with the electroconductive plate are provided in a manner that the first metal layer of the first plate structure faces an opening of the hole of the second plate structure.

The disclosed circuit board contains a plurality of plate structures, each of which contains a cured insulating material, a first metal layer in the form of a pattern formed on one surface of the insulating material, and a via formed in the insulating material, where the via reaches the first metal layer from a surface of the insulating material opposite to a surface thereof, at which the first metal layer has been formed.

The first metal layer is embedded in the insulating material in the plate structure, and one surface of the first metal layer and one surface of the insulating material are on an identical plane.

Among the plurality of the plate structures, a first plate structure containing the via and a second plate structure containing the via are provided in a manner that the first metal layer of the first plate structure faces an opening of a via of the second plate structure.

The via is a hole filled with an electroconductive member.

A formation method of the via is appropriately selected depending on the intended purpose without any limitation, and examples thereof include a method containing filling the hole with the electroconductive paste, laminating a plurality of the plate structures, and applying heat and pressure.

One surface of the first metal layer and one surface of the plate structure being on the identical plane is, in other words, that a thickness of the insulating material 2 is not uniform, a thickness (T1) of a part of the insulating material 2 of the plate structure 100 where there is no first metal layer 1, as observed from the surface of the insulating material 2 is larger than a thickness (T2) of a part of the insulating material 2 where there is the first metal layer 1, and the T1 is equal to a sum of the T2 and a thickness of the first metal layer 1, as illustrated in FIG. 1. In other words, moreover, there is no irregularities originated from the first metal layer 1 on a surface of the plate structure 100, and a thickness of the plate structure 100 is uniform.

One surface of the first metal layer is preferably a rough surface. A method for forming the rough surface is appropriately selected depending on the intended purpose without any limitation, and examples thereof include a CZ surface treatment (a treatment of copper surface of zigzag). The arithmetic average roughness (Ra) of the rough surface is, for example, 1.0 µm to 2.0 µm.

One example of the disclosed method for forming a circuit board is explained with reference to drawings.

First Embodiment

<<Formation of Plate Structure>>

First, one example of formation of a plate structure is explained.

FIG. 1 illustrates one example of a plate structure formed through the formation of a plate structure. The plate structure 100 contains a cured insulating material 2, and a first metal layer 1 in the formed of a pattern that is formed on one surface of the insulating material 2. In the plate structure 100, the first metal layer 1 is embedded in the insulating material 2, and one surface of the first metal layer 1 and one surface of the insulating material 2 are on the identical plane.

Next, one example of a method for forming the plate structure 100 illustrated in FIG. 1 is explained.

—Production of Laminate—

Figure 2A:
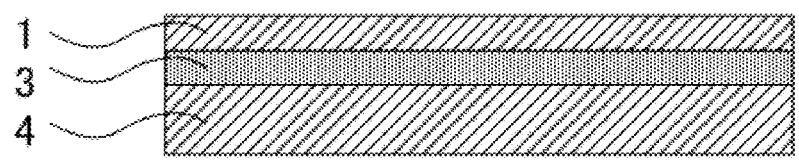
FIG. 2A is a schematic cross-sectional view explaining one example of a method for forming a plate structure 100 (part 1).
Figure 2B:
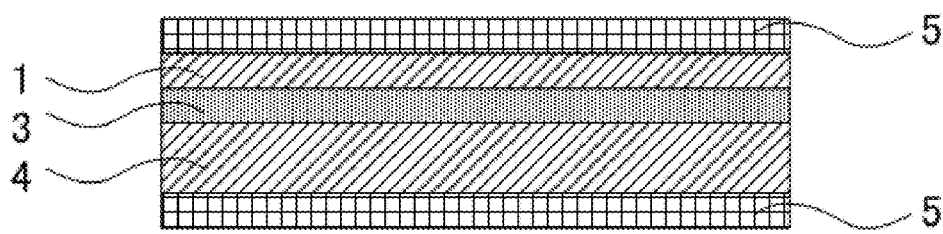
FIG. 2B is a schematic cross-sectional view explaining one example of a method for forming a plate structure 100 (part 2).
Figure 2C:
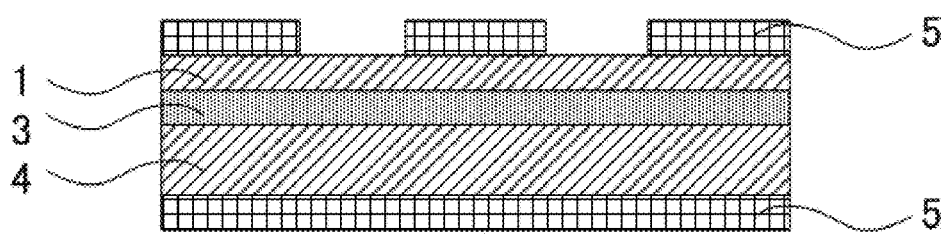
FIG. 2C is a schematic cross-sectional view explaining one example of a method for forming a plate structure 100 (part 3).
Figure 2D:
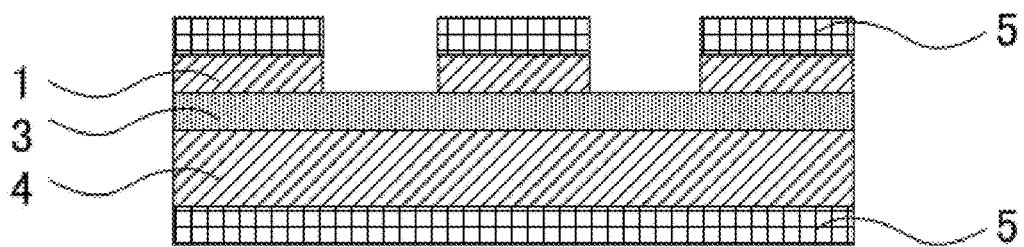
FIG. 2D is a schematic cross-sectional view explaining one example of a method for forming a plate structure 100 (part 4).
Figure 2E:
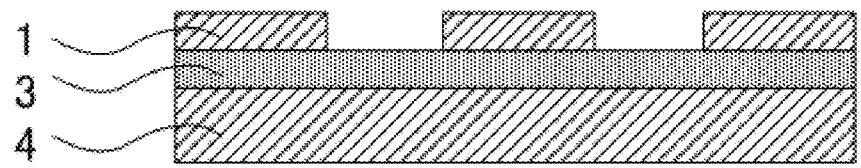
FIG. 2E is a schematic cross-sectional view explaining one example of a method for forming a plate structure 100 (part 5).

First, produced is a laminate containing a metal support 4 formed of copper, a second metal layer 3 formed of nickel, and a first metal layer 1 in the form of a pattern formed of copper in this order (FIG. 2E).

The laminate can be obtained, for example, by preparing a laminate (FIG. 2A), in which the metal support 4, the second metal layer 3, and the first metal layer 1 are laminated in this order, and patterning the first metal layer 1 through a subtractive process.

Specifically, photoresist layers 5 are each provided on the metal support 4 and the first metal layer 1 of the laminate illustrated in FIG. 2A, respectively (FIG. 2B). Subsequently, exposure and developing are performed to form a predetermined pattern with the photoresist layer 5 on the first metal layer 1 (FIG. 2C). Then, the exposed areas of the first metal layer 1 formed of copper are etched by alkali etching to thereby form the first metal layer 1 in the form of a pattern (FIG. 2D). Subsequently, the photoresist layer 5 is removed. In the manner as described, the laminate containing the metal support 4 formed of copper, the second metal layer 3 formed of nickel, and the first metal layer 1 in the form of a pattern formed of copper in this order can be obtained (FIG. 2E).

The average thickness of the metal support 4 is appropriately selected depending on the intended purpose without any limitation, but the average thickness thereof is preferably 10 µm to 100 µm, more preferably 20 µm to 80 µm, and even more preferably 25 µm to 65 µm. When the average thickness thereof is within the aforementioned even more preferable range, a strength of the laminate is high, and the laminate to which a subtractive process is easily applied can be obtained.

The average thickness of the second metal layer 3 is appropriately selected depending on the intended purpose without any limitation, but the average thickness thereof is preferably 0.5 µm to 10 µm, more preferably 0.8 µm to 5 µm. The second metal layer having the average thickness within the aforementioned more preferable range is advantageous because the second metal layer can be easily removed.

The average thickness of the first metal layer 1 is appropriately selected depending on the intended purpose without any limitation, but the average thickness thereof is preferably 10 µm to 50 µm, more preferably 20 µm to 30 µm.

A plate structure is produced using the laminate obtained in the aforementioned manner. As a result, a size stability of the first metal layer in the form of a pattern in the plate structure is extremely excellent.

—Production of Plate Structure—

Figure 3A:
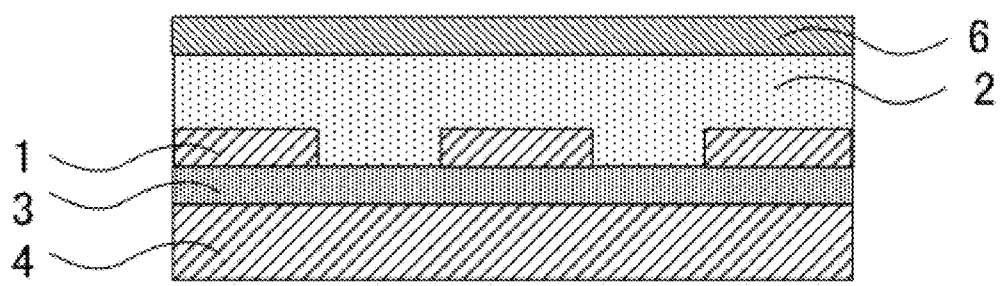
FIG. 3A is a schematic cross-sectional view explaining one example of a method for forming a plate structure 100 (part 6).
Figure 3B:
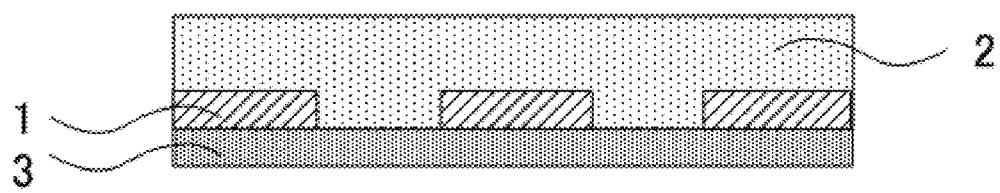
FIG. 3B is a schematic cross-sectional view explaining one example of a method for forming a plate structure 100 (part 7).
Figure 3C:
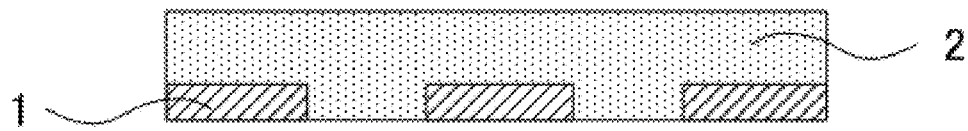
FIG. 3C is a schematic cross-sectional view explaining one example of a method for forming a plate structure 100 (part 8).
Figure 3D:
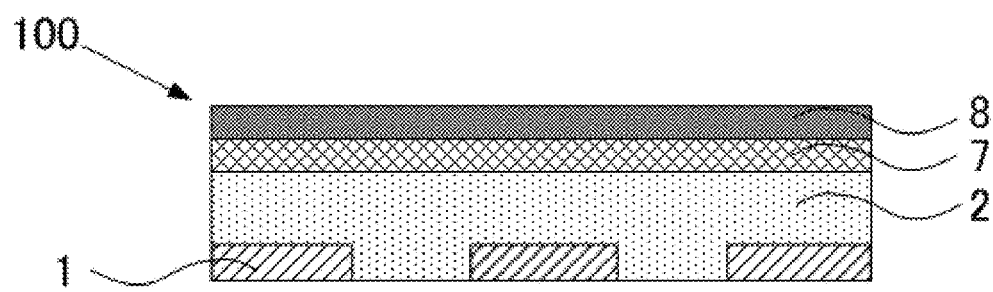
FIG. 3D is a schematic cross-sectional view explaining one example of a method for forming a plate structure 100 (part 9).

Next, an insulating material (uncured insulating material) 2 is provided on the patterned first metal layer 1 of the obtained laminate, and a third metal layer 6 formed of copper is further provided on the insulating material 2. Subsequently, the insulating material 2 is completely cured (FIG. 3A). Then, the metal support 4 formed of copper and the third metal layer 6 formed of copper are removed by alkali etching (FIG. 3B). During the etching, the second metal layer 3 formed of nickel functions as a barrier metal that prevents the first metal layer 1 from being etched. Subsequently, the second metal layer 3 formed of nickel is etched (FIG. 3C). Then, an adhesive layer 7 and a release layer 8 are provided on the insulating material 2 by laminating to thereby obtain a plate structure 100 (FIG. 3D).

In the plate structure 100, one surface of the first metal layer 1 and one surface of the insulating metal 2 layer are on the identical plane.

<<Formation of Hole Until First Metal Layer>>

Next, one example of the opening a hole in the cured insulating material until reaching the first metal layer is explained.

Figure 4:
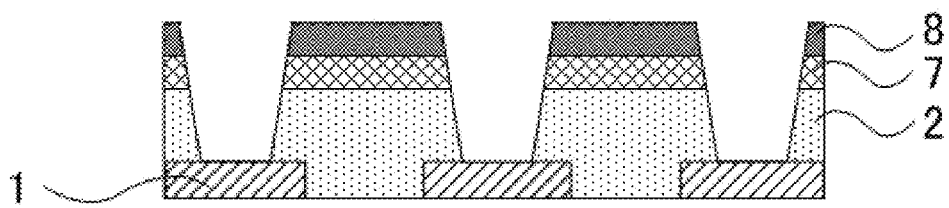
FIG. 4 is a schematic cross-sectional view explaining one example of a process where a hole is opened in a cured insulating material until reaching a first metal layer.

To the plate structure 100 (FIG. 3D) obtained in the formation of the plate structure, $CO_2$ laser is applied from a surface of the plate structure 100 opposite to the surface thereof at which the first metal layer 1 has been formed, to thereby open a hole in the cured insulating material 2 until reaching the first metal layer 1 (FIG. 4). The formed hole has a shape where a diameter of the hole is gradually reduced from the opening thereof to the first metal layer 1 (tapered shape).

<<Filling with Electroconductive Paste>>

Next, one example of the formation of the plate structure filled with the electroconductive paste is explained.

Figure 5A:
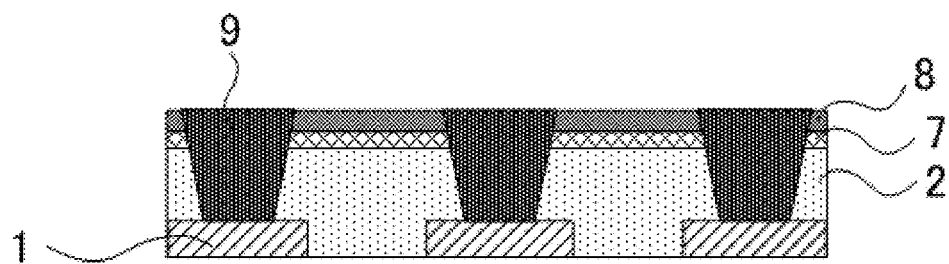
FIG. 5A is a schematic cross-sectional view explaining one example of formation of a plate structure filled with an electroconductive paste (part 1).

The hole formed through the opening a hole is filled with an electroconductive paste 9 using a squeegee (FIG. 5A). As the release layer 8 is provided, the release layer 8 functions as a printing mask during this process. In the case where the squeegee is used, therefore, the hole is filled with the electroconductive paste 9 without smearing a surface of the adhesive layer 7.

Figure 5B:
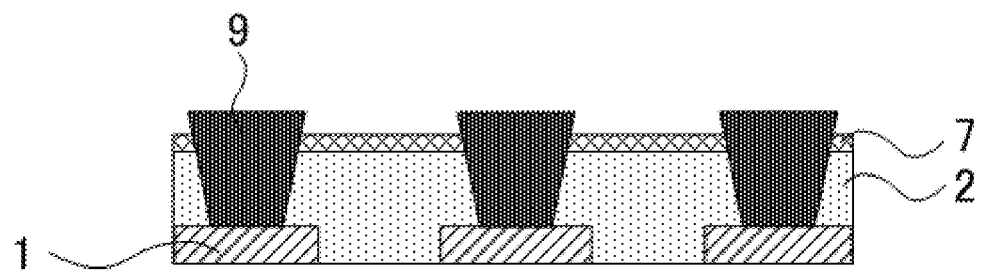
FIG. 5B is a schematic cross-sectional view explaining one example of formation of a plate structure filled with an electroconductive paste (part 2).

After filling the hole with the electroconductive paste 9, the release layer 8 is peeled off (FIG. 5B).

<<Laminating>>

Next, one example of the laminating is explained.

Figure 6A:
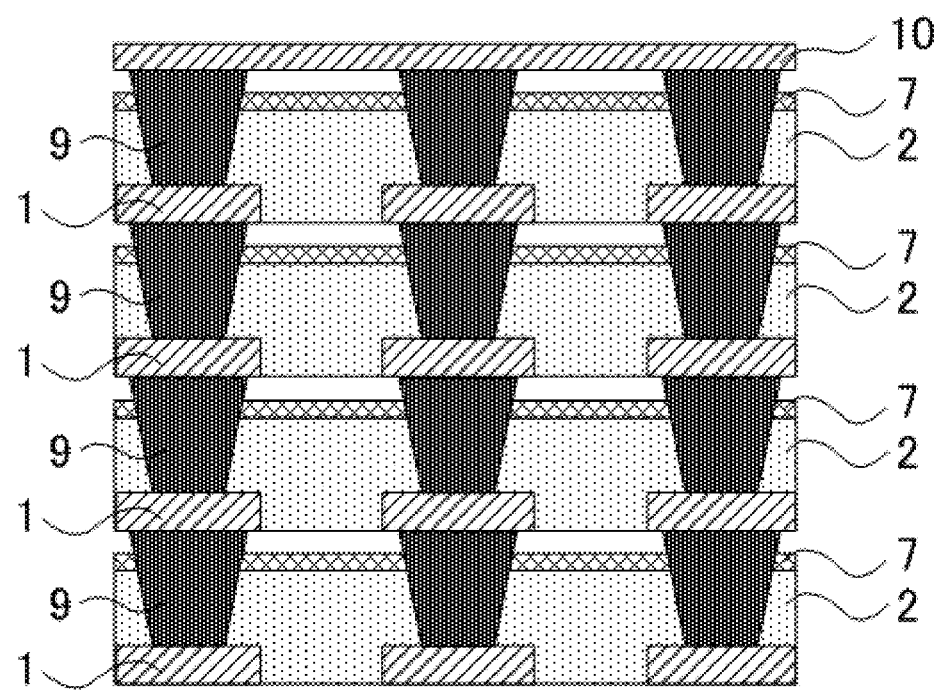
FIG. 6A is a schematic cross-sectional view explaining one example of laminating (part 1).
Figure 6B:
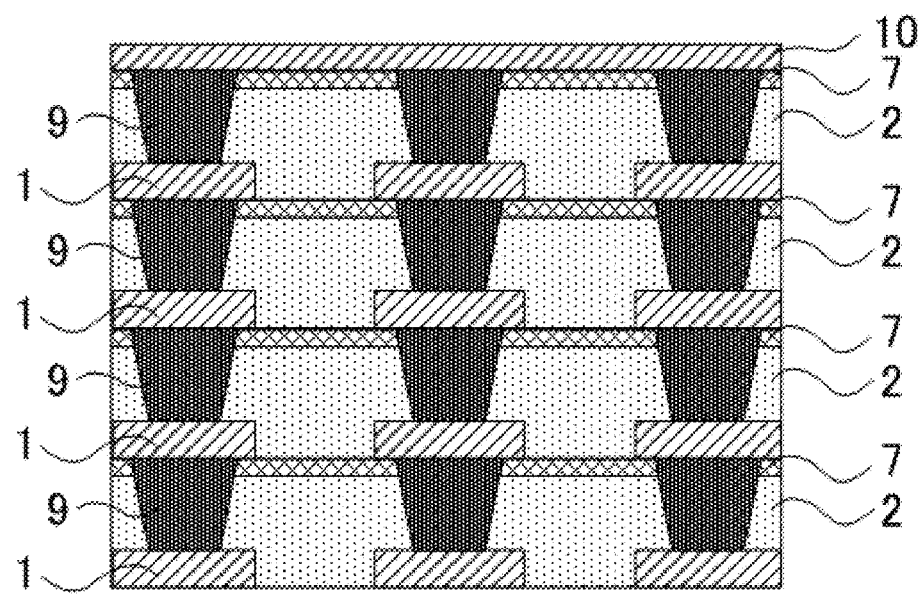
FIG. 6B is a schematic cross-sectional view explaining one example of laminating (part 2).

Using a plurality of the plate structures each filled with the electroconductive paste obtained in the production of the plate structure filled with the electroconductive paste, one plate structure filled with the electroconductive paste and the other plate structure filled with the electroconductive plate are laminated in a manner that the first metal of the one plate structure filled with the electroconductive paste faces an opening of the hole of the other plate structure filled with the electroconductive paste (FIG. 6A). Note that, in this embodiment, a fourth metal layer 10 formed of copper is provided at an outermost surface. Subsequently, the obtained laminate is pressed to thereby form a multi-layer circuit board (FIG. 6B).

In the first embodiment, the insulating material is completely cured before laminating a plurality of the plate structures 100, and therefore a size stability of the obtained multi-layer circuit board is excellent, and thicknesses of the plate structures each filled with the electroconductive paste can be made uniform.

Second Embodiment

<<Formation of Plate Structure>>

First, one example of the formation of the plate structure is explained.

Figure 7:
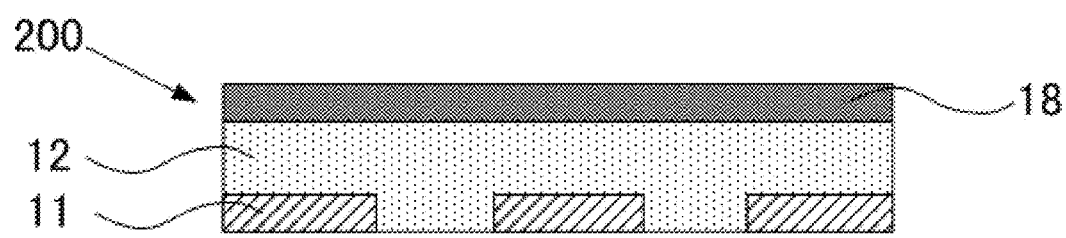
FIG. 7 is a schematic cross-sectional view illustrating another example of a plate structure.

FIG. 7 illustrates one example of a plate structure formed by the production of the plate structure. The plate structure 200 contains a cured insulating material 12, and a first metal layer 11 in the form of a pattern formed on the insulating material 12. In the plate structure 200, the first metal layer 11 is embedded in the insulating material 12, and one surface of the first metal layer 11 and one surface of the insulating material 12 are on the identical plane. Moreover, the plate structure 200 contains a release layer 18 on a surface of the insulating material 12 opposite to a surface thereof at which the first metal layer 11 has been formed.

Next, one example of a method for forming the plate structure 200 illustrated in FIG. 7 is explained.

—Production of Laminate—

Figure 8:
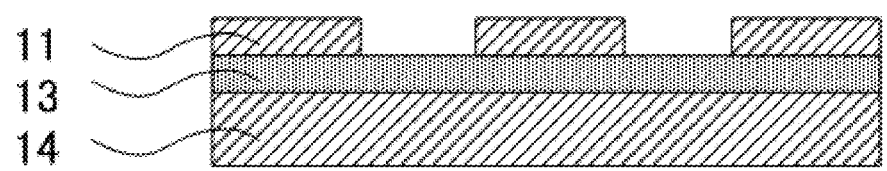
FIG. 8 is a schematic cross-sectional view explaining one example of a method for forming a plate structure 200 (part 1).

First, produced is a laminate containing a metal support 14 formed of copper, a second metal layer 13 formed of nickel, and a first metal layer 11 in the form of a pattern formed of copper in this order (FIG. 8). Examples of the production method thereof include a production method depicted in FIGS. 2A to 2E.

—Production of Plate Structure—

Figure 9A:
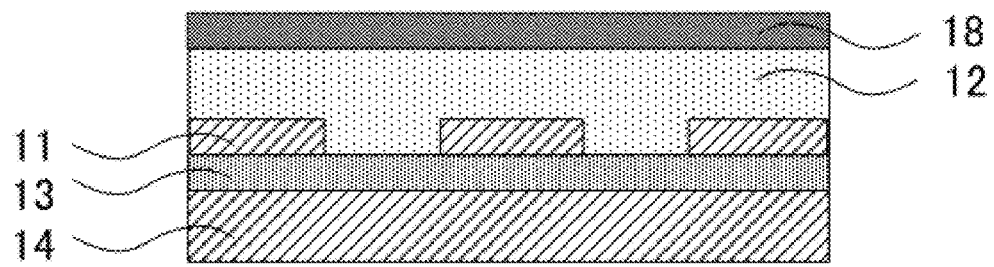
FIG. 9A is a schematic cross-sectional view explaining one example of a method for forming a plate structure 200 (part 2).
Figure 9B:
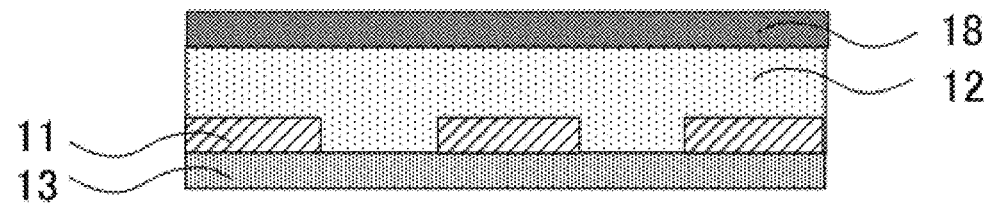
FIG. 9B is a schematic cross-sectional view explaining one example of a method for forming a plate structure 200 (part 3).
Figure 9C:
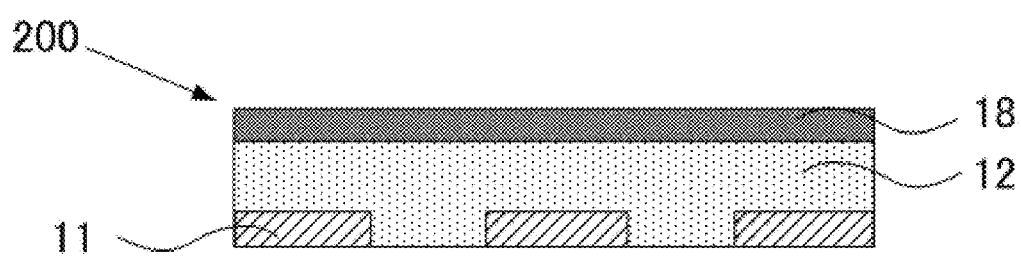
FIG. 9C is a schematic cross-sectional view explaining one example of a method for forming a plate structure 200 (part 4).

Next, an insulating material (uncured insulating material) 12 is provided on the patterned first metal layer 11 of the obtained laminate, and a release layer 18 is further provided on the insulating material 12. Subsequently, the insulating material 12 is semi-cured (FIG. 9A). Then, the metal support 14 formed of copper is removed by alkali etching (FIG. 9B). During the etching, the second metal layer 13 formed of nickel functions as a barrier metal that prevents the first metal layer 11 from being etched. Subsequently, the second metal layer 13 formed of nickel is etched to thereby obtain a plate structure 200 (FIG. 9C).

In the plate structure 200, one surface of the first metal layer 11 and one surface of the plate structure 12 are on the identical plane.

<<Formation of Hole Until First Metal Layer>>

Next, one example of the opening a hole in the cured insulating material until reaching the first metal layer is explained.

Figure 10:
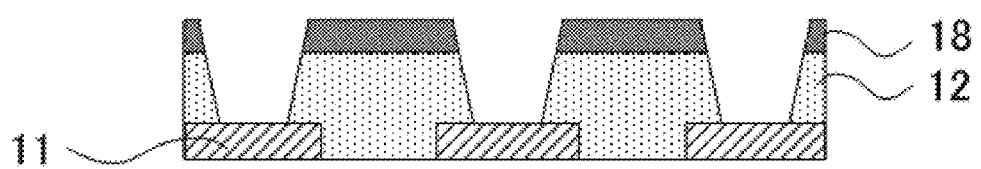
FIG. 10 is a schematic cross-sectional view explaining one example of a process where a hole is opened in a cured insulating material until reaching a first metal layer.

To the plate structure 200 (FIG. 9C) obtained in the formation of the plate structure, $CO_2$ laser is applied from a surface of the plate structure 200 opposite to the surface thereof at which the first metal layer 11 has been formed, to thereby open a hole in the cured insulating material 12 until reaching the first metal layer 11 (FIG. 10). The formed hole has a shape where a diameter of the hole is gradually reduced from the opening thereof to the first metal layer 11 (tapered shape).

<<Filling with Electroconductive Paste>>

Next, one example of the formation of the plate structure filled with the electroconductive paste is explained.

Figure 11A:
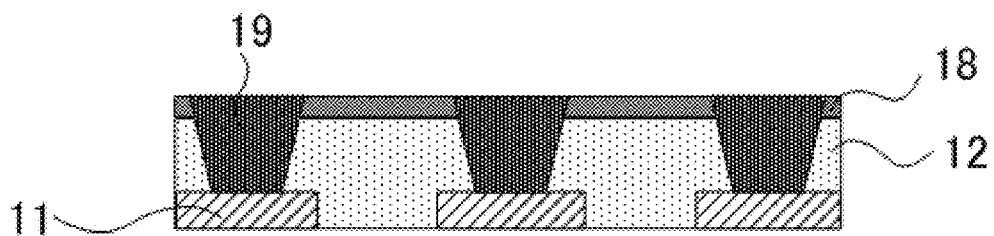
FIG. 11A is a cross-sectional view explaining one example of formation of a plate structure filled with an electroconductive paste (part 1).

The hole formed through the opening a hole is filled with an electroconductive paste 19 using a squeegee (FIG. 11A). As the release layer 18 is provided, the release layer 18 functions as a printing mask during this process. In the case where the squeegee is used, therefore, the hole is filled with the electroconductive paste 19 without smearing a surface of the insulating material 12.

Figure 11B:
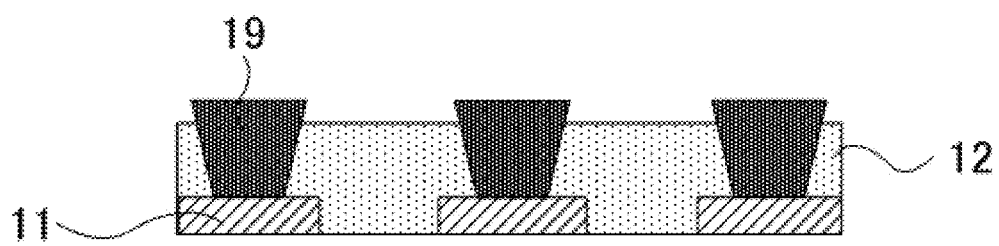
FIG. 11B is a cross-sectional view explaining one example of formation of a plate structure filled with an electroconductive paste (part 2).

After filling the hole with the electroconductive paste 19, the release layer 18 is peeled off (FIG. 11B).

<<Laminating>>

Next, one example of the laminating is explained.

Figure 12A:
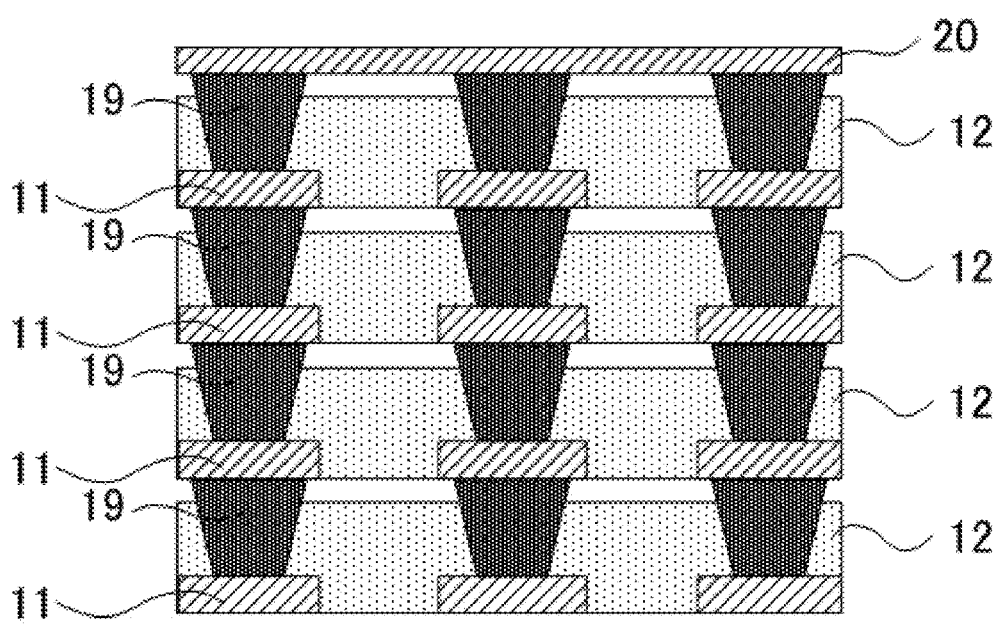
FIG. 12A is a cross-sectional view explaining one example of laminating (part 1).
Figure 12B:
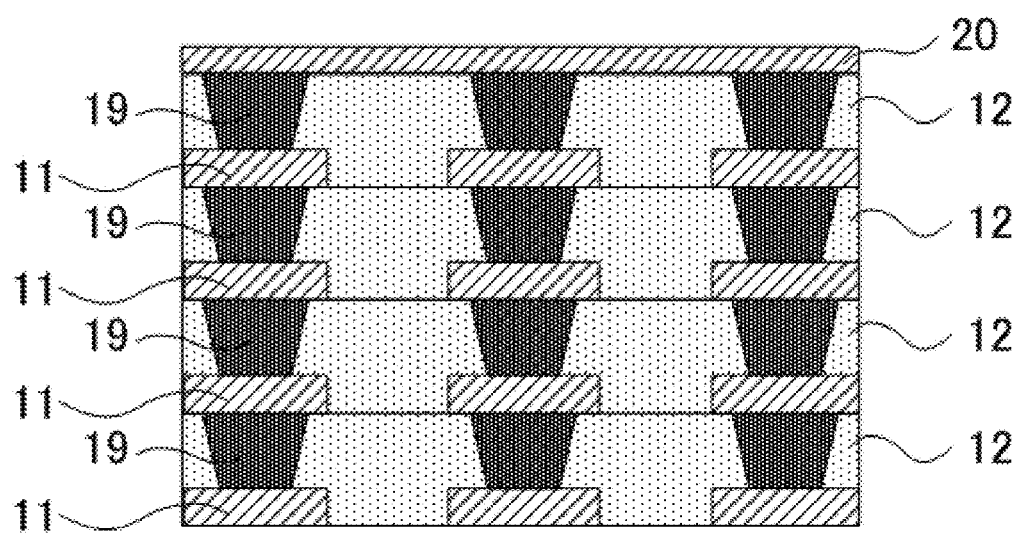
FIG. 12B is a cross-sectional view explaining one example of laminating (part 1).

Using a plurality of the plate structures each filled with the electroconductive paste obtained in the production of the plate structure filled with the electroconductive paste, one plate structure filled with the electroconductive paste and the other plate structure filled with the electroconductive plate are laminated in a manner that the first meta layer of the one plate structure filled with the electroconductive paste faces an opening of the hole of the other plate structure filled with the electroconductive paste (FIG. 12A). Note that, in this embodiment, a fourth metal layer 20 formed of copper is provided at an outermost surface. Subsequently, the obtained laminate is heated and pressed to thereby form a multi-layer circuit board (FIG. 12B).

In the second embodiment, the insulating material is semi-cured before laminating a plurality of the plate structures 200, thus it is not necessary to provide an adhesive layer at the time of laminating. Therefore, the obtained multi-layer circuit board can prevent curling caused due to an adhesive layer.

Third Embodiment

Figure 13:
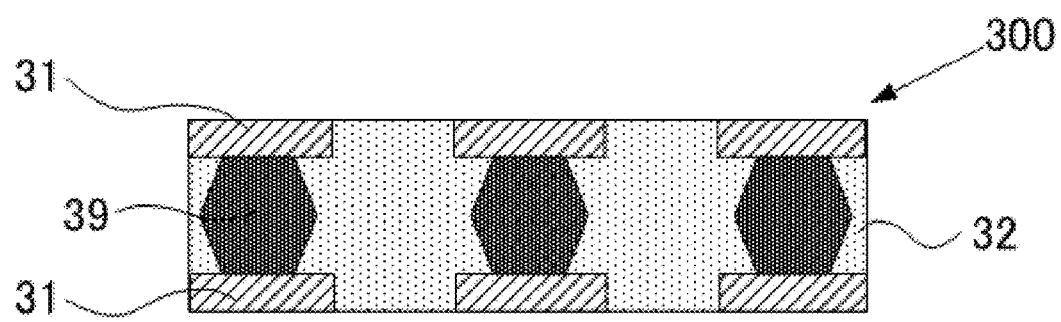
FIG. 13 is a cross-sectional view illustrating one example of a center plate structure.

The third embodiment is an embodiment, in which a center plate structure 300 illustrated in FIG. 13 is produced, and plate structures each filled with an electroconductive paste are respectively laminated on both surfaces of the center plate structure 300.

Figure 14A:
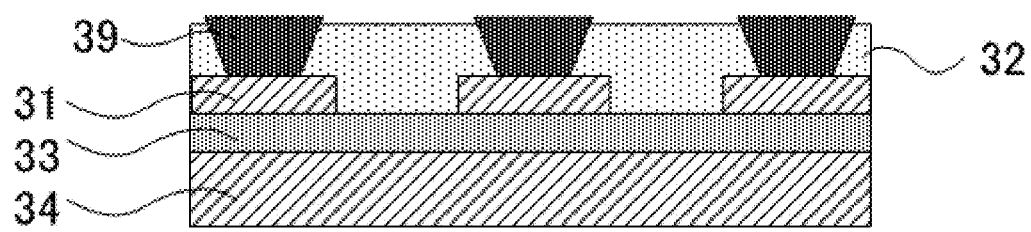
FIG. 14A is a cross-sectional view explaining one example of a method for forming a center plate structure (part 1).
Figure 14B:
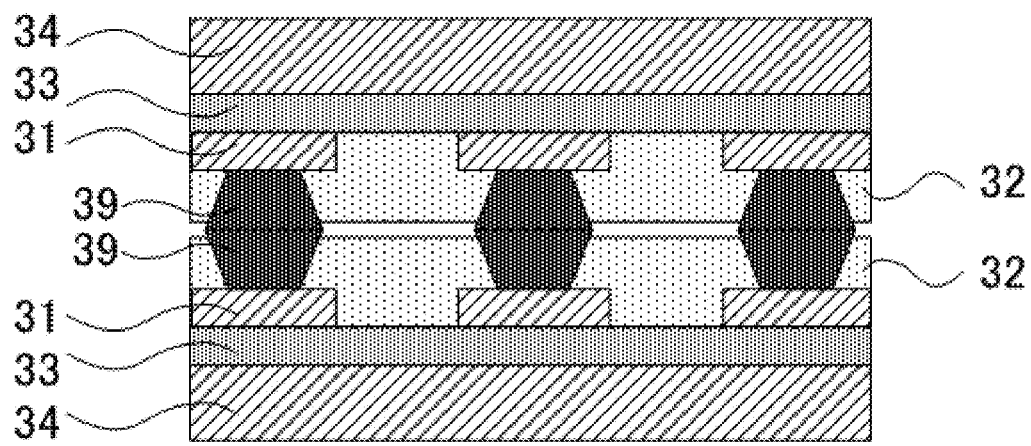
FIG. 14B is a cross-sectional view explaining one example of a method for forming a center plate structure (part 2).

The center plate structure 300 illustrated in FIG. 13 contains an insulating material 32, a first metal layer 31 in the form of a pattern embedded in both surfaces of the insulating material 32, and an electroconductive paste 39 loaded in the insulating material 32. As illustrated in FIGS. 14A and 14B, the center plate structure 300 can be produced by two layers each containing a metal support 34, a second metal layer 33, the first metal layer 31 in the form of a pattern, the insulating material 32, and the electroconductive paste 39, and laminating the layers in a manner that the electroconductive paste 39 of one layer faces the electroconductive paste 39 of the other layer. The two layers can be easily produced, for example, with reference to the processes depicted in FIGS. 2 to 5, and FIGS. 9 to 11.

Figure 15A:
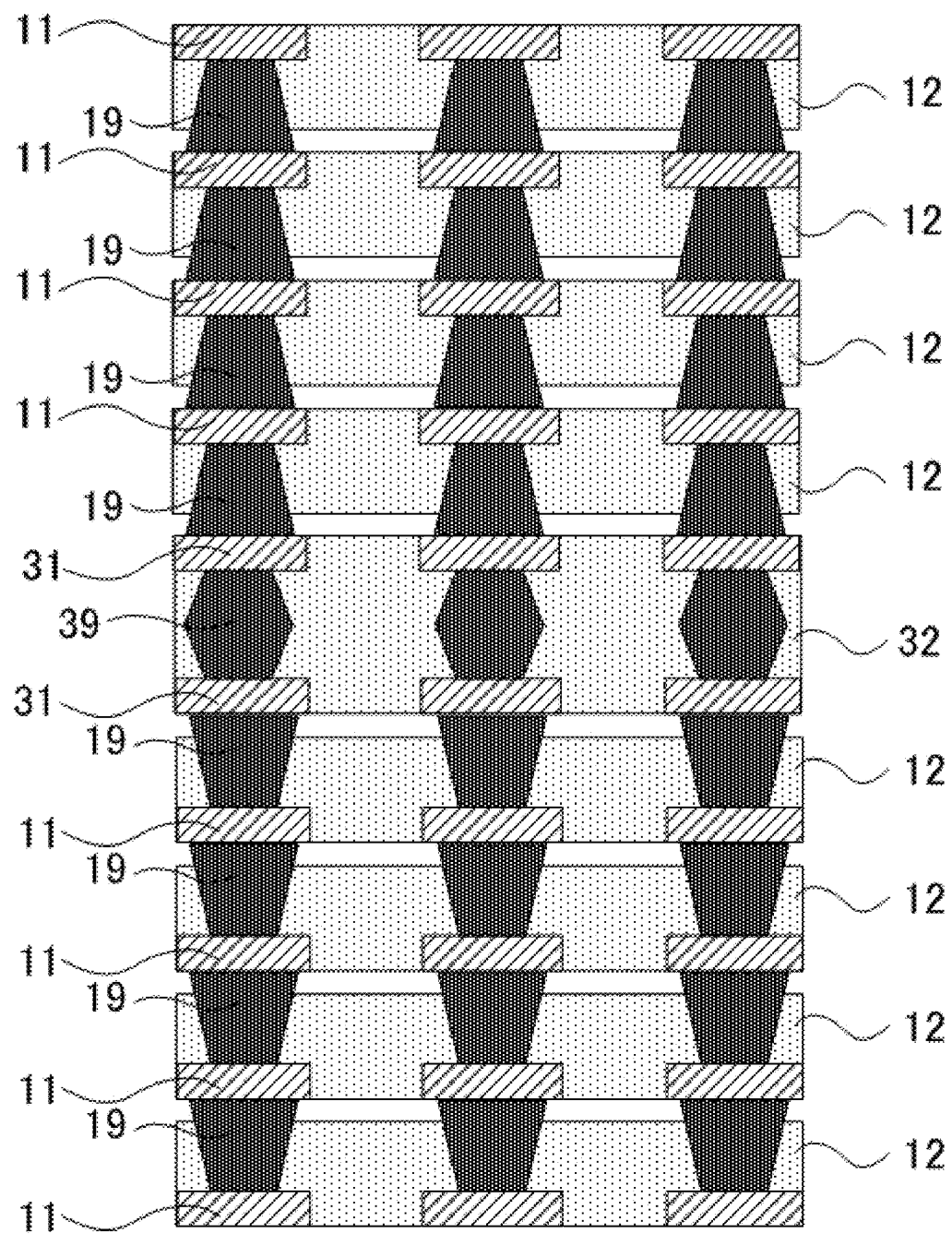
FIG. 15A is a cross-sectional view explaining one example of laminating (part 1).
Figure 15B:
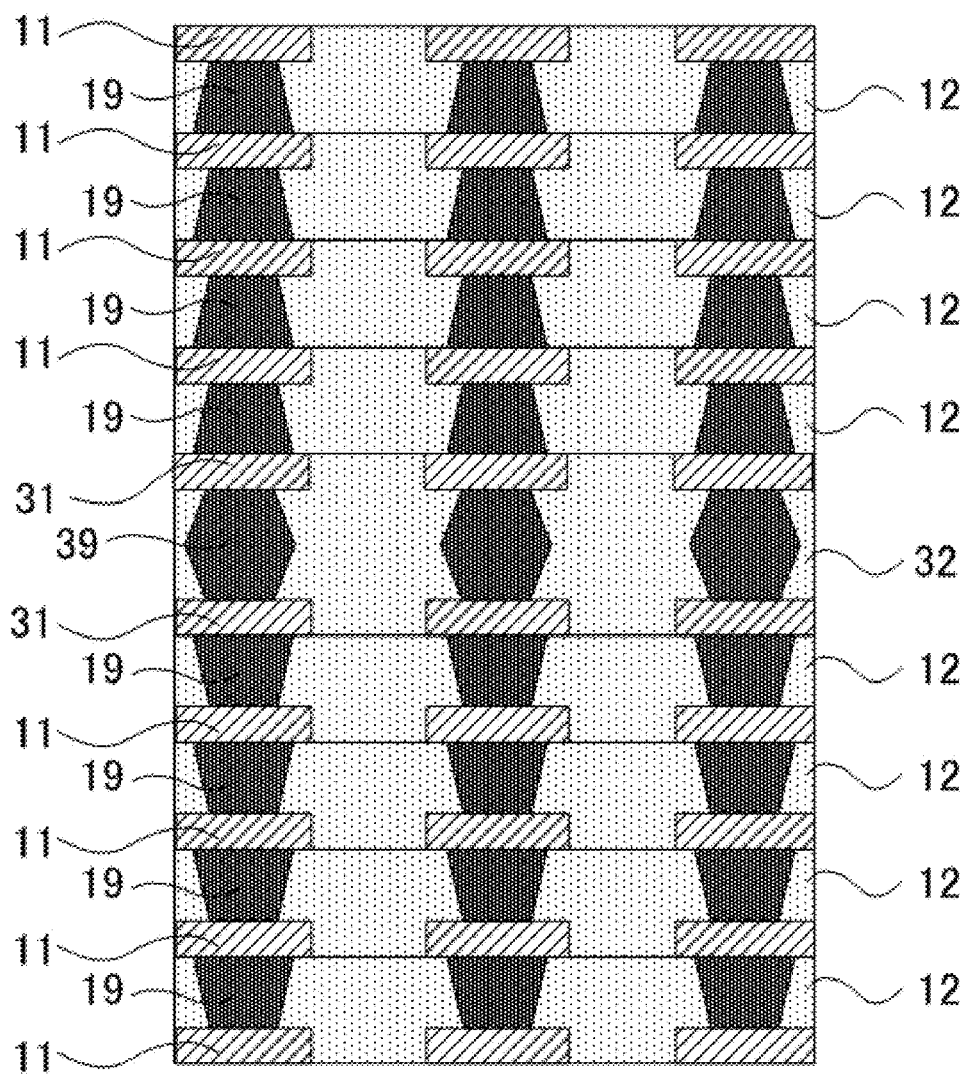
FIG. 15B is a cross-sectional view explaining one example of laminating (part 2).

In the same manner as in the laminating of the second embodiment, using a plurality of the plate structures each filled with the electroconductive paste, one plate structure filled with the electroconductive paste and the other plate structure filled with the electroconductive paste are respectively laminated on the both surfaces of the center plate structure 300 in a manner that the first layer of the one plate structure filled with the electroconductive paste faces an opening of the hole of the other plate structure filled with the electroconductive paste (FIG. 15A). Subsequently, the obtained laminate is pressed to thereby form a multi-layer circuit board (FIG. 15B).

Fourth Embodiment

Figure 16:
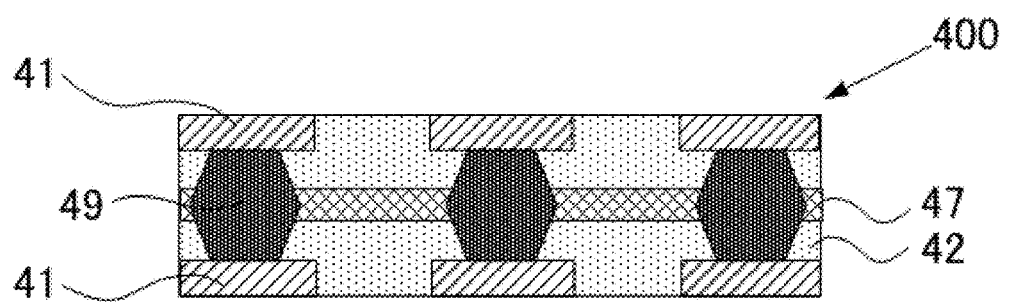
FIG. 16 is a cross-sectional view illustrating another example of a center plate structure.

The fourth embodiment is an embodiment, in which a center plate structure 400 illustrated in FIG. 16 is produced, and plate structures each filled with an electroconductive paste are respectively laminated on both surfaces of the center plate structure 400.

Figure 17A:
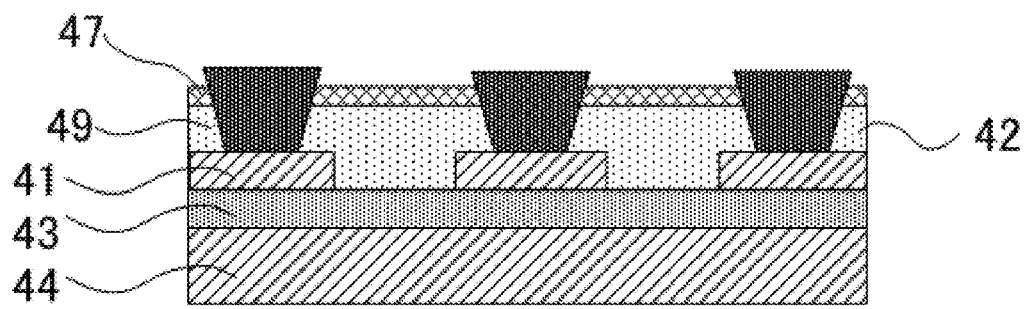
FIG. 17A is a cross-sectional view explaining one example of a method for forming a center plate structure (part 1).
Figure 17B:
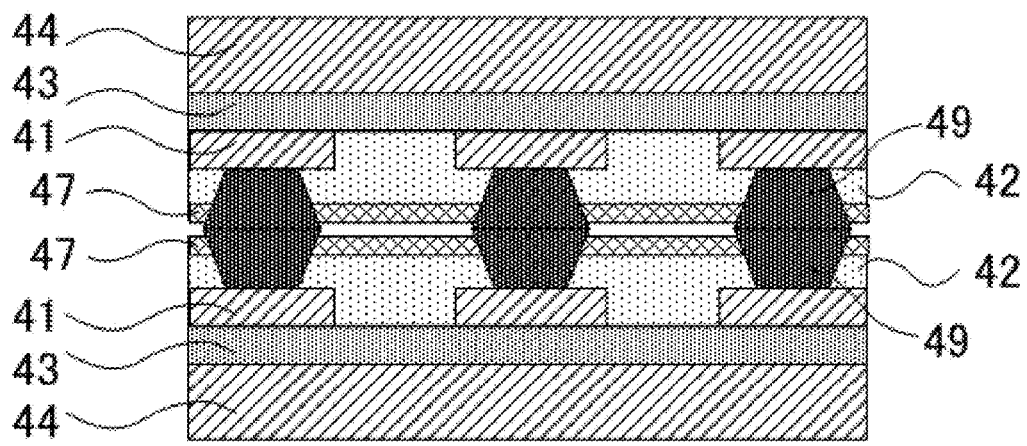
FIG. 17B is a cross-sectional view explaining one example of a method for forming a center plate structure (part 2).

The center plate structure 400 illustrated in FIG. 16 contains an insulating material 42, a first metal layer 41 in the form of a pattern embedded in both surfaces of the insulating material 42, an electroconductive paste 49 in the insulating material 42, and an adhesive layer 47 that divides the insulating material 42 into an upper side and a lower side. As illustrated in FIGS. 17A and 17B, the center plate structure 400 can be produced by using two layers each containing a metal support 44, a second metal layer 43, the first metal layer 41 in the form of a pattern, the insulating material 42, the electroconductive paste 49, and the adhesive layer 47, and laminating the layers in a manner that the electroconductive paste 49 of one layer faces the electroconductive paste 49 of the other layer. The two layers can be easily produced, for example, with reference to the processes depicted in FIGS. 2 to 5, and FIGS. 9 to 11.

Figure 18A:
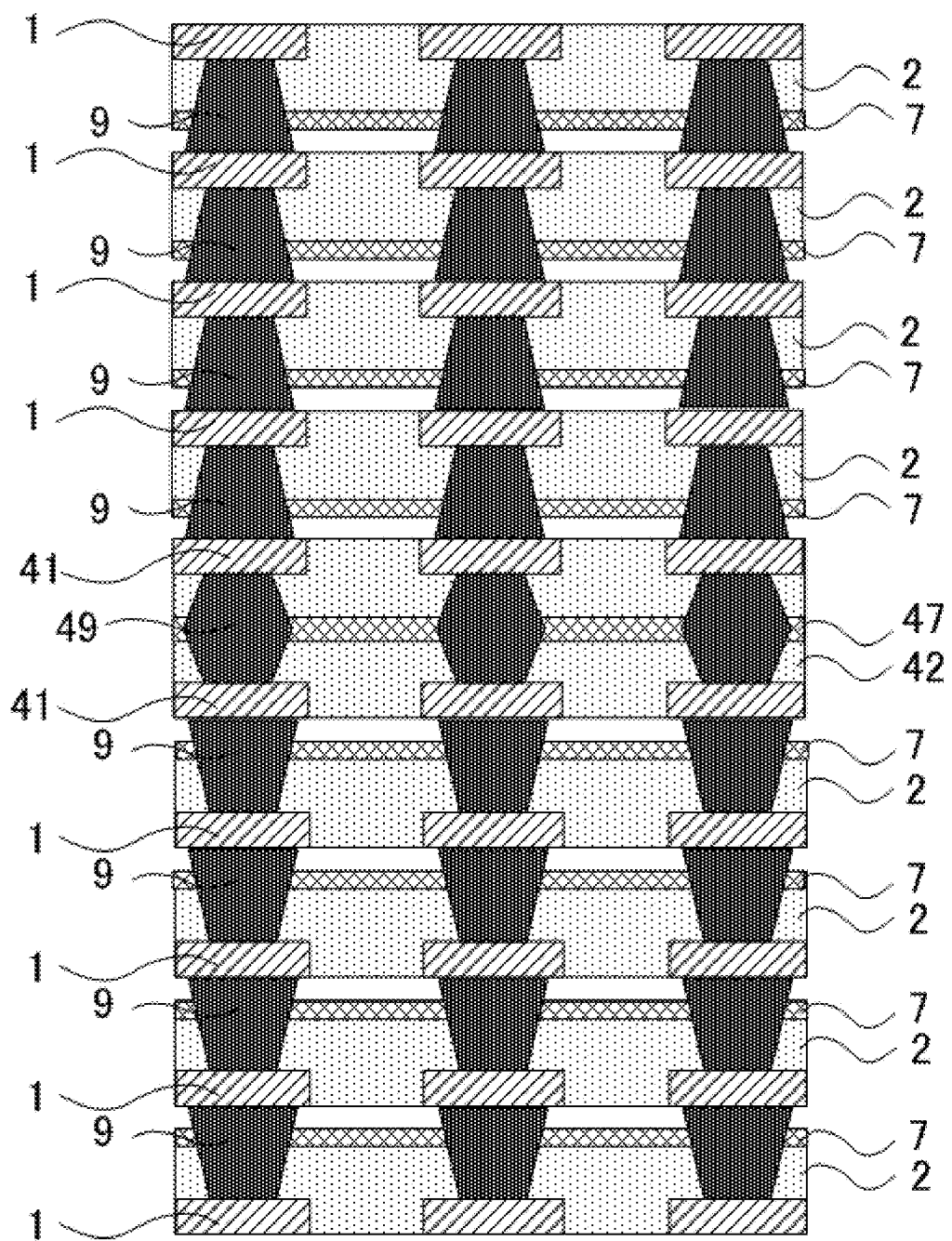
FIG. 18A is a cross-sectional view explaining one example of laminating (part 1).
Figure 18B:
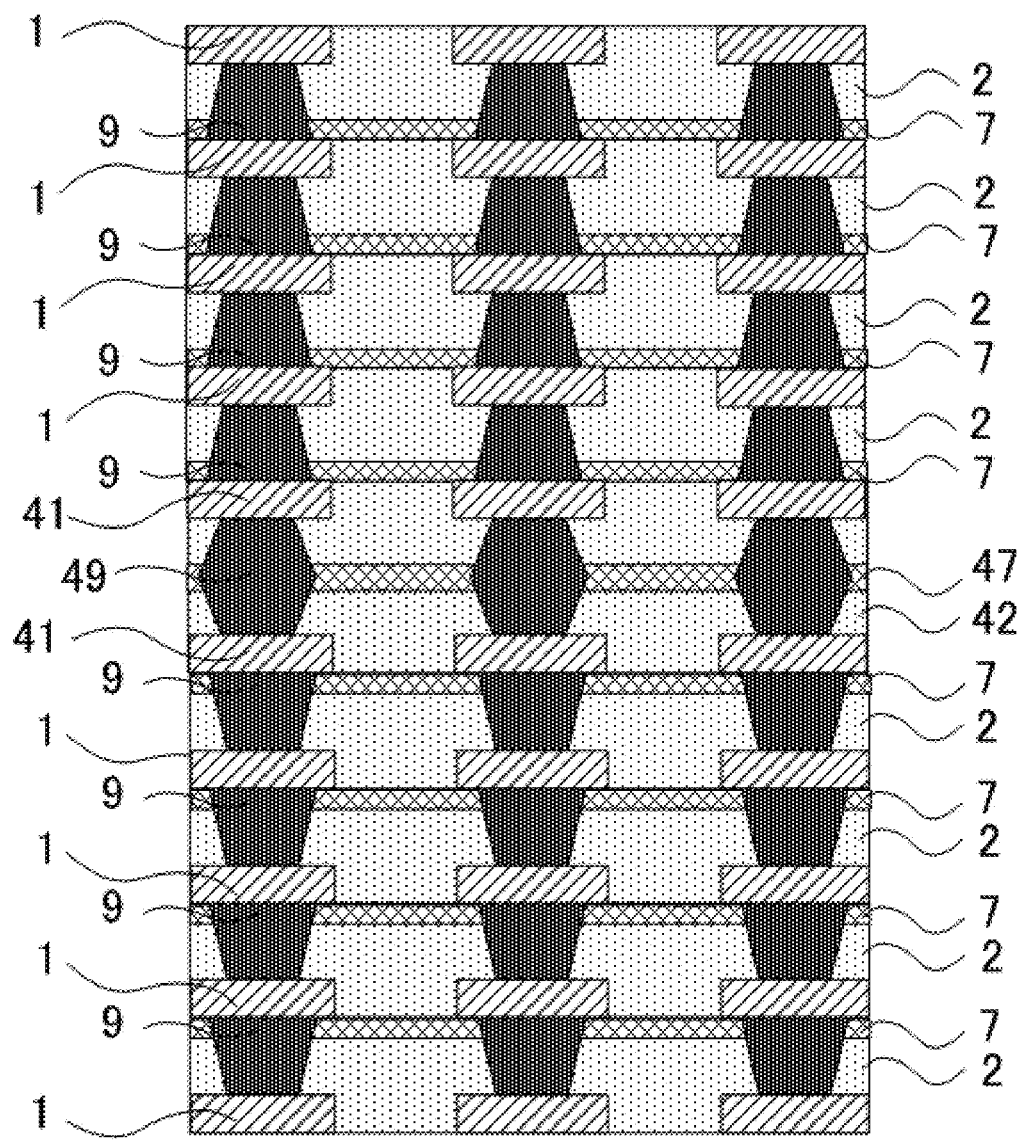
FIG. 18B is a cross-sectional view explaining one example of laminating (part 2).

In the same manner as in the laminating of the first embodiment, using a plurality of the plate structures each filled with the electroconductive paste, one plate structure filled with the electroconductive paste and the other plate structure filled with the electroconductive paste are respectively laminated on the both surfaces of the center plate structure 400 in a manner that the first metal layer of the one plate structure filled with the electroconductive paste faces an opening of the hole of the other plate structure filled with the electroconductive paste (FIG. 18A). Subsequently, the obtained laminate is pressed to thereby form a multi-layer circuit board (FIG. 18B).

Note that, the electroconductive paste used in the first to fourth embodiments may be of the pressure welding type, or of the melting type.

In the multi-layer circuit boards illustrated in FIGS. 6B, 12B, 15B, and 18B, the hole filled with the electroconductive paste may be referred to as a via.

<<Another Embodiment of Formation Method of Laminate>>

One example of another embodiment of a method for forming a laminate is described.

A method explained hereinafter is a method using a semi-additive process.

Figure 19A:
FIG. 19A is a cross-sectional view explaining one example of a method for forming a laminate (part 1).
Figure 19B:
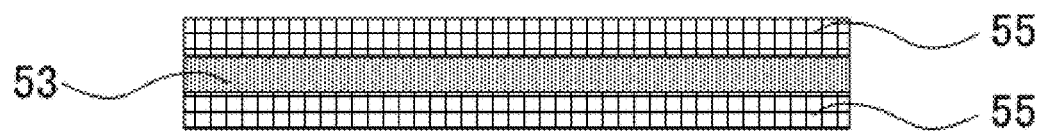
FIG. 19B is a cross-sectional view explaining one example of a method for forming a laminate (part 2).
Figure 19C:
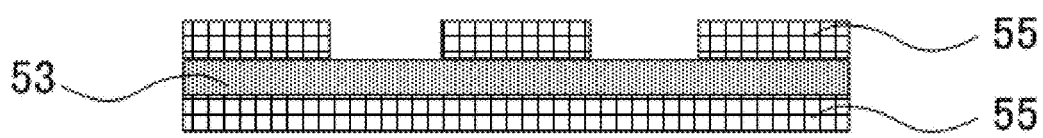
FIG. 19C is a cross-sectional view explaining one example of a method for forming a laminate (part 3).
Figure 19D:
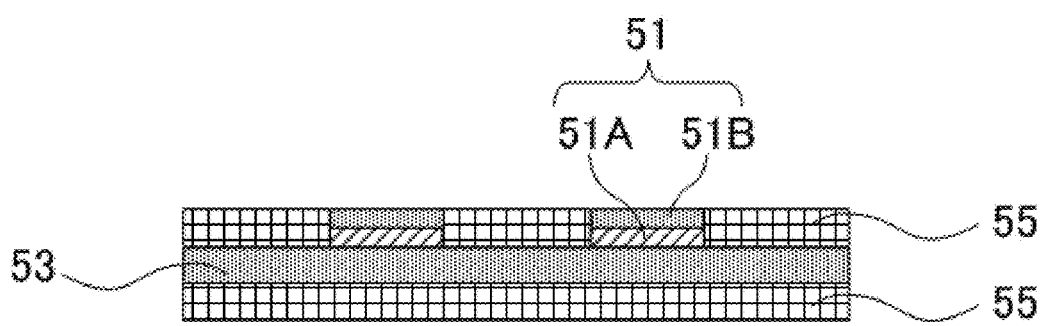
FIG. 19D is a cross-sectional view explaining one example of a method for forming a laminate (part 4).
Figure 19E:
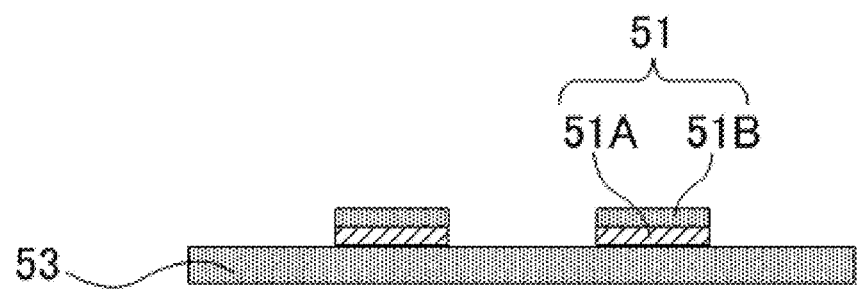
FIG. 19E is a cross-sectional view explaining one example of a method for forming a laminate (part 5).

First, a second metal layer 53 formed of copper is prepared (FIG. 19A). Subsequently, photoresist layers 55 are provided on both surfaces of the second metal layer 53, respectively (FIG. 19B). Then, the photoresist layer 55 provided on one side of the second metal layer 53 is subjected to exposure and developing to form a predetermined pattern (FIG. 19C). Subsequently, a first metal layer 51 in the form of a pattern, which contains a first A layer 51A formed of nickel and a first B layer 51B formed of copper in this order, is formed on the second metal layer 53 by plating (FIG. 19D). Then, the photoresist layers 55 are removed. In the manner described above, a laminate containing the second metal layer 53 formed of copper, and the first metal layer 51 in the form of a pattern formed of nickel and copper is obtained (FIG. 19E).

As this method is used, the first A layer 51A formed of nickel that is a different metal to copper constituting the second metal layer functions as a barrier metal, which prevents the first metal layer 51 from being etched, when the second metal layer 53 is removed through etching in the later process. Since the second metal layer is formed of copper, moreover, a cost can be kept low.

One example of yet another embodiment of a method for forming a laminate is described.

A method explained hereinafter is a method using a semi-additive process.

Figure 20A:
FIG. 20A is a cross-sectional view explaining another example of a method for forming a laminate (part 1).
Figure 20B:
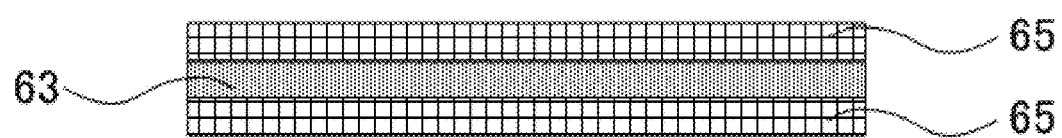
FIG. 20B is a cross-sectional view explaining another example of a method for forming a laminate (part 2).
Figure 20C:
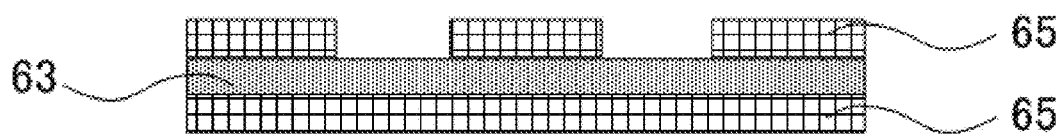
FIG. 20C is a cross-sectional view explaining another example of a method for forming a laminate (part 3).
Figure 20D:
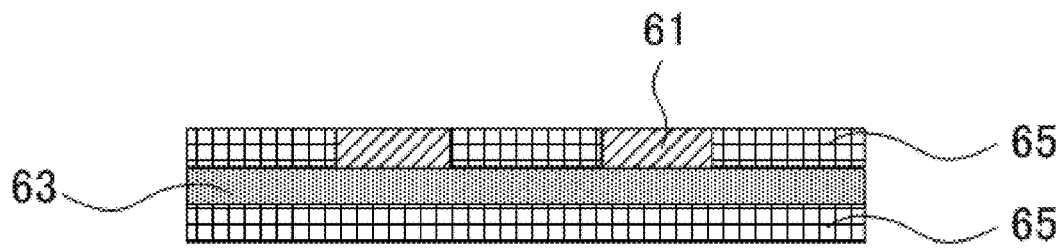
FIG. 20D is a cross-sectional view explaining another example of a method for forming a laminate (part 4).
Figure 20E:
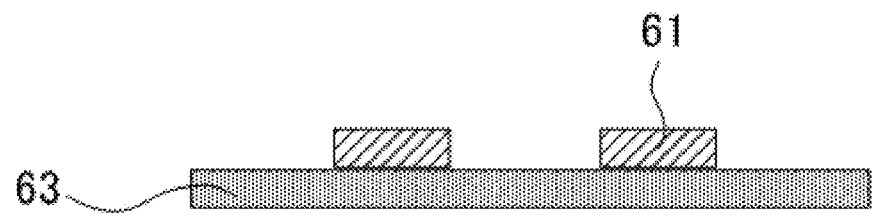
FIG. 20E is a cross-sectional view explaining another example of a method for forming a laminate (part 5).

First, a second metal layer 63 formed of aluminum is prepared (FIG. 20A). Subsequently, photoresist layers 65 are provided on both surfaces of the second metal layer 63, respectively (FIG. 20B). Then, the photoresist layer 65 on one side of the second metal layer 63 is subjected to exposure and developing to form a predetermined pattern (FIG. 20C). Subsequently, a first metal layer 61 in the form of a pattern formed of copper is formed on the second metal layer 63 by plating (FIG. 20D). Then, the photoresist layers 65 are removed. In the manner described above, a laminate containing the second metal layer 63 formed of aluminum, and the first metal layer 61 in the form of a pattern formed of copper in this order is obtained (FIG. 20E).

Use of this method enables to produce a laminate with a short process.

A circuit board produced by the disclosed method for producing a circuit board, and the disclosed circuit board are each usable as a mother board (supporting substrate), are also usable as an interposer (relay substrate), and are also usable as a circuit board constituting a semiconductor element.

Figure 21:
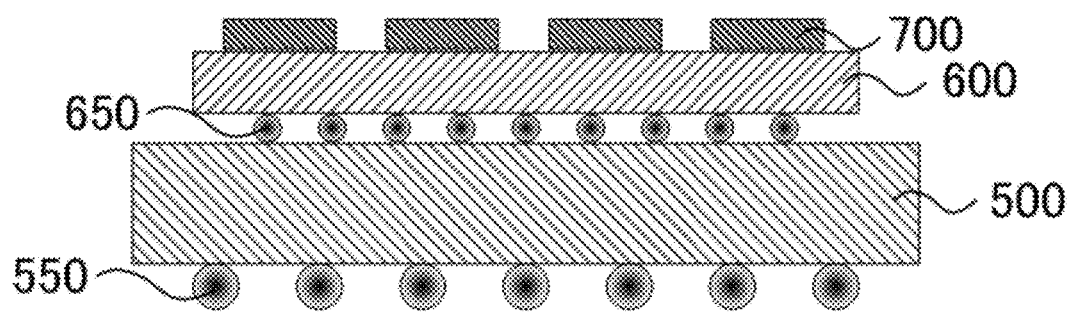
FIG. 21 is a schematic diagram illustrating a semiconductor package.

FIG. 21 is a schematic cross-sectional view of a semiconductor package. The semiconductor package of FIG. 21 contains a mother board 500 including soldering balls 550, an interposer 600 connected onto the mother board 500 through bumps 650, and a semiconductor element 700 provided on the interposer 600. Examples of the semiconductor element 700 include a field programmable gate array (FPGA) chip.

A circuit board produced by the disclosed method for producing a circuit board, and the disclosed circuit board are each usable as the mother board 500, or usable as the interposer 600, or usable as a circuit board constituting the semiconductor element 700 in FIG. 21.

(Electronic Equipment)

The disclosed electronic equipment contains at least the disclosed circuit board, and electronic parts, and may further contain other members according to the necessity.

Examples of the electronic equipment include a mobile phone, a computer, and a tablet mobile terminal.

The disclosed method for producing a circuit board can solve the aforementioned various problems in the art, achieve the aforementioned object, and produce a circuit board having a uniform thickness in a short production process.

The disclosed circuit board can solve the aforementioned various problems in the art, achieve the aforementioned object, and attain a circuit board having a uniform thickness in a short production process.

The disclosed electronic equipment can solve the aforementioned various problems in the art, achieve the aforementioned object, and shorten the production process thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the sprit and scope of the invention.

What is claimed is:

1. A method for producing a circuit board, comprising:
   adhering a plastic deformable insulating material onto a surface of a laminate, where the laminate contains a metal support, a second metal layer formed of a second metal, and a first metal layer in form of a pattern formed on the second metal layer in this order, and the surface of the laminate is a surface of the second metal layer at which the first metal layer has been formed, and onto a surface of the first metal layer, followed by forming a third metal layer on the insulating material, followed by completely curing the insulating material, followed by removing the metal support and the third metal layer, and followed by removing the second metal layer to form a plate structure to which the first metal layer in form of a pattern is formed;
   opening a hole in the cured insulating material from a surface of the plate structure opposite to a surface thereof at which the first metal layer has been formed, until the hole reaches the first metal layer;

filling the hole with an electroconductive paste, to form the plate structure filled with the electroconductive paste; and laminating one plate structure filled with the electroconductive paste with other plate structure filled with the electroconductive paste in a manner that the first metal layer of the one plate structure filled with the electroconductive paste faces an opening of the hole of the other plate structure filled with the electroconductive paste, wherein the first metal layer contains a metal different from the second metal.

2. The method according to claim 1, wherein the curing the insulating material is complete curing, wherein the plate structure further contains an adhesive layer, and a release layer in this order on a surface of the plate structure opposite to a surface thereof at which the first metal layer has been formed, during the opening the hole in the cured insulating material, and wherein the release layer is peeled off after the filling the hole with the electroconductive paste.

3. The method according to claim 1, wherein the curing the insulating material is semi-curing, wherein the plate structure further contains a release layer on a surface of the plate structure opposite to a surface thereof at which the first metal layer has been formed, during the opening the hole in the cured insulating material, and wherein the release layer is peeled off after the filling the hole with the electroconductive paste.

4. The method according to claim 1, wherein a surface of the third metal layer in contact with the insulating material has an arithmetic average roughness (Ra) of 1.0 μm or less.

* * * * *